US009163997B2

(12) United States Patent
Vassant et al.

(10) Patent No.: US 9,163,997 B2
(45) Date of Patent: Oct. 20, 2015

(54) TERAHERTZ DETECTION CELL

(75) Inventors: Simon Vassant, Paris (FR); Fabrice Pardo, Vitry-sur-Seine (FR); Jean-Luc Pelouard, Paris (FR); Jean-Jacques Greffet, Verrières le Buisson (FR); Alexandre Archambault, Paris (FR); François Marquier, Longjumeau (FR)

(73) Assignee: Centre National de la Recherche Scientifique—CNRS, Paris (FR)

( * ) Notice: Subject to any disclaimer, the term of this patent is extended or adjusted under 35 U.S.C. 154(b) by 0 days.

(21) Appl. No.: 13/985,498

(22) PCT Filed: Feb. 14, 2012

(86) PCT No.: PCT/EP2012/052524
§ 371 (c)(1),
(2), (4) Date: Mar. 10, 2014

(87) PCT Pub. No.: WO2012/110522
PCT Pub. Date: Aug. 23, 2012

(65) Prior Publication Data
US 2014/0175283 A1 Jun. 26, 2014

(30) Foreign Application Priority Data
Feb. 14, 2011 (FR) .................................... 11 51195

(51) Int. Cl.
*G01J 5/20* (2006.01)
*H01L 31/09* (2006.01)
(Continued)

(52) U.S. Cl.
CPC ................. *G01J 5/20* (2013.01); *H01L 31/036* (2013.01); *H01L 31/03046* (2013.01); *H01L 31/035209* (2013.01); *H01L 31/08* (2013.01); *H01L 31/09* (2013.01); *Y02E 10/544* (2013.01)

(58) Field of Classification Search
CPC .................................... G01J 5/20; H01L 31/09
USPC ......................................... 250/338.4; 257/459
See application file for complete search history.

(56) References Cited

U.S. PATENT DOCUMENTS 6,479,822 B1 * 11/2002 Nelson et al. ............... 250/341.1
8,039,802 B2 * 10/2011 Shin et al. .................. 250/341.1
(Continued)

OTHER PUBLICATIONS

International Search Report issued in PCT/EP2012/052524 mailed on Jul. 27, 2012 (6 pages).
Written Opinion of the International Searching Authority issued in PCT/EP2012/052524 mailed on Jul. 27, 2012 (5 pages).
(Continued)

*Primary Examiner* — David Porta
*Assistant Examiner* — Faye Boosalis
(74) *Attorney, Agent, or Firm* — Osha • Liang LLP

(57) ABSTRACT

According to a first aspect of the invention, the invention relates to a terahertz detection cell for detecting radiations having frequencies within a given spectral detection band, said cell comprising: a polar semi-conductor crystal structured such that it forms at least one slab of crystal, said crystal (330) having a Reststrahlen band covering said spectral detection band, and comprising at least one interface with a dielectric means; coupling means obtained by the slab structure (330), each slab forming an optical antenna, enabling the resonant coupling of an interface phonon polariton (IPhP) supported by said interface and an incident radiation having a frequency within the spectral detection band; and at least one first and one second connection terminal (301, 302) that are in electrical contact respectively with a first and a second end of the interface, said ends opposing each other, and said connection terminals to be connected to an electrical reading circuit for measuring the variation of the impedance of the crystal between the opposing ends of the interface.

20 Claims, 6 Drawing Sheets

(51) Int. Cl.
*H01L 31/08* (2006.01)
*H01L 31/0304* (2006.01)
*H01L 31/0352* (2006.01)
*H01L 31/036* (2006.01)

(56) References Cited

U.S. PATENT DOCUMENTS

2008/0315098 A1 12/2008 Itsuji
2012/0091342 A1* 4/2012 Berger et al. ............... 250/338.4

OTHER PUBLICATIONS

Vassant, S. et al.; "Tailoring GaAs terahertz radiative properites with surface phonons polaritons"; Applied Physics Letters, vol. 97, No. 16, Oct. 18, 2010, pp. 161101-161101-3 (3 pages).

Marquier, F. et al.; "Resonant emission and transmission of infrared radiation by microstructured surfaces supporting surface phonon-polaritons"; Quantum Electronics and Laser Science, XP10692064A, Jun. 1, 2003 (3 pages).

Sizov, F. et al.; "THz detectors"; Progress in Quantum Electronics, vol. 34, 2010, pp. 278-347, XP27218165A, Sep. 2010 (70 pages).

* cited by examiner

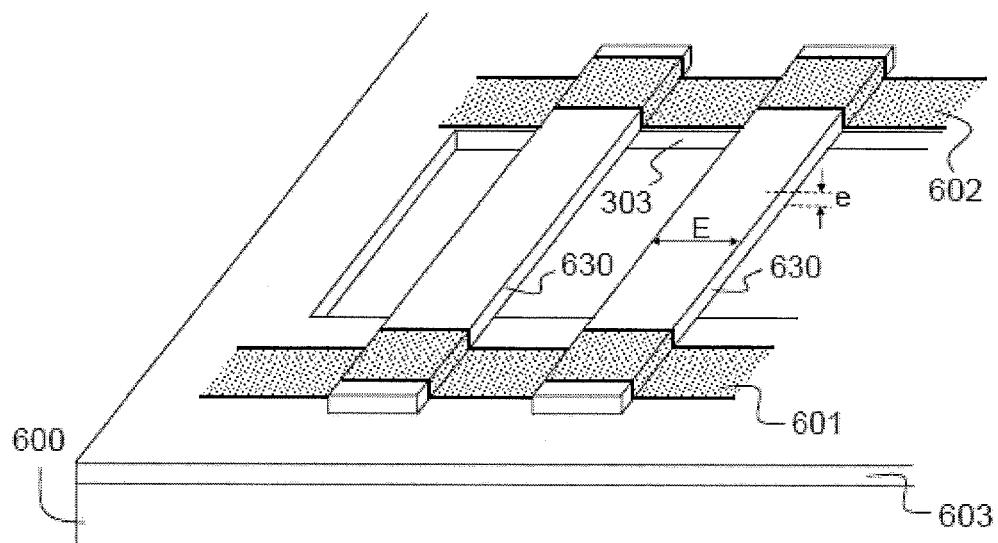
FIG.6
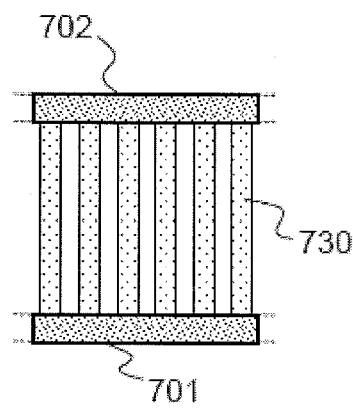  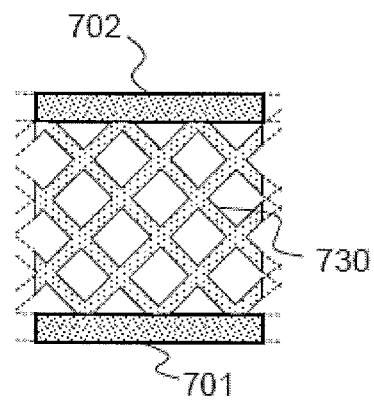
FIG.7A  FIG.7B ained a few $10^{-11}/HZ^{1/2}$. Among direct detectors, the
TERAHERTZ DETECTION CELL

TECHNICAL DOMAIN OF THE INVENTION

The present invention relates a terahertz detection cell and a detector for terahertz radiations comprising one or a plurality of said cells, and a terahertz detection method.

STATE OF THE ART

The terahertz domain is generally defined by radiations having frequencies of between 0.1 and 30 THz. This frequency band overlaps the domain of electronics and the domain of photonics. The devices in the terahertz domain come up against intrinsic operating limits: the working frequencies are too high for components based on electronics and the energies are too low to work effectively with photons. Nevertheless, this frequency domain has a high potential for applications, for example in the domain of imaging or telecommunications, in which the frequency ranges usually allocated to telecommunications are reaching saturation. Notably, the allocation of ranges of frequencies up to 0.3 THz is already saturated in the United States. This potential for applications is encouraging work notably on the development of photodetectors that allow radiations to be detected in this frequency range.

THZ detectors can be divided into two main families, incoherent detectors that are sensitive to the intensity of the radiation and coherent detectors that are sensitive to the amplitude of the radiation and give access to the phase thereof. The articles by F. Sizov et A. Rogalski ('THZ detectors', Progress in Quantum Electronics 34(5), 278-347 (2010)), F. Sizov ('THZ radiation sensors', Opto-electronics Review 18(1), 10-36) and the book by J. L. Coutaz (Optoélectronique THZ, EDP Science (2008)) for example present documented reviews of existing THZ detectors. Coherent detectors use the heterodyne technique in which the detected THZ signal is combined with a signal coming from a local oscillator of known frequency. The two signals are then mixed to obtain a signal of much lower frequency (typically in the GHZ range) that can then be amplified by low noise amplifiers. Information concerning the amplitude and the phase of the THZ signal is conserved. This conversion is necessary since there are no THZ amplifiers at this time. This technique, which, notably compared to direct or incoherent detection, allows the modulation of the frequency and the phase to be detected, presents excellent sensitivity and a better signal to noise ratio since the dominant noise derives from the fluctuation of the signal coming from the local oscillator, rather than background noise. However, strong constraints on the detected signal and the signal coming from the local oscillator must be respected to implement this type of detection, complicating the development of matrices composed of this type of detector for imaging. Among direct detectors, notably thermal detectors are known, for example Golay cells, pyroelectric detectors, bolometers and micro-bolometers, Schottky diodes and photoconductive antennas. As an example, the patent application US 2008/0315098 describes a photoconductive antenna composed of a transmission line formed by two co-planar metallic conductors arranged on an insulating semi-conductor. A part of this line is used as an antenna in the THZ domain. This device is intended for ultra-fast temporal sampling using photogeneration by a visible laser. The sensitivity of detectors operating at ambient temperature does not exceed a few $10^4$ V/W for a noise equivalent power (or NEP) greater than a few $10^{-11}/HZ^{1/2}$. Among direct detectors, the most efficient operate at cryogenic temperatures.

One object of the present invention is to present a terahertz detector, operating at ambient temperature and exhibiting good sensitivity and low noise equivalent power. The detector described in the present application is based on the use of interface phonon polaritons.

SUMMARY OF THE INVENTION

According to a first aspect, the invention relates to a terahertz detection cell for the detection of radiations of frequencies included in a given spectral detection band, comprising:
- a semi-conductor polar crystal having a Reststrahlen band covering said spectral detection band and having at least one interface with a dielectric medium.
- coupling means allowing the resonant coupling of an interface phonon polariton (IPhP) supported by said interface and an incident radiation of frequency included in said spectral detection band; and
- at least one first and one second connection terminals in electrical contact respectively with a first and a second opposite ends of said interface and intended to be connected to an electrical reading circuit for the measurement of the impedance variation of the crystal between said opposite ends of the interface.

The resonance effect of the dielectric function of a polar crystal in the so-called Reststrahlen band of the crystal is thus used to create a terahertz detector of remarkable efficiency which operates at ambient temperature. The impedance variation resulting from the absorption by the free carriers of the crystal of interface phonon polaritons excited by the incident terahertz wave is measured to detect the luminous intensity incident on the detection cell.

Advantageously, the polar crystal has at least two interfaces with the dielectric medium, said interfaces being sufficiently close to allow the coupling of interface phonon polaritons propagating along each of the interfaces. The coupling of the two interface phonon polariton modes allows the confinement of the electromagnetic field to be further accentuated and the efficiency of the detector to be improved, notably by making the impedance variation more sensitive in the semiconductor crystal.

Typically the distance between the two interfaces can be less than a hundred nanometers.

According to an example, the semiconductor polar crystal is a III-V semiconductor, for example gallium arsenide (GaAs), aluminum arsenide (AlAs), indium phosphide (InP), indium arsenide (InAs), gallium phosphide (GaP), gallium nitride (GaN), etc. According to another example, the semiconductor polar crystal is a II-VI semi-conductor, for example zinc selenide (ZnSe), mercury telluride (HgTe), cadmium telluride (CdTe), etc. or a I-VII semi-conductor, for example sodium chloride (NaCl), potassium bromide (KBr), etc. According to another example, the semi-conductor polar crystal is a IV-IV semi-conductor such as silicon carbide (SiC). Moreover, ternary alloys (with three elements, such as AlGaAs for example), quaternary alloys (with four elements, InGaAlAs for example) or more, can also be used. In the following description, the term semi-conductor polar crystal encompasses all of these materials.

According to a variant, the polar crystal is doped. The generation of free carriers in the polar crystal allows the resonance band of the dielectric function to be widened and/or shifted.

According to a first embodiment of the detection cell according to the invention, the polar crystal is structured to form one or a plurality of cristal blades each forming an optical antenna intended to couple with the incident radiation, the large faces of each of said blades forming two interfaces with a dielectric medium, the connection terminals being in electrical contact with two opposite ends of said blades.

According to one example, the polar crystal is structured to form a group of a plurality of blades, laid out along a principal direction.

According to another example, the polar crystal is structured to form a group of a plurality of blades, laid out along two substantially perpendicular directions.

According to one example, the polar crystal is structured to form a group of a plurality of identical blades, the shape and size of the blades being thus optimized for a narrow spectral detection band.

According to another example, the polar crystal is structured to form a group of a plurality of blades, and at least a part of the blades have a different shape from that of the others, allowing the detection frequency band to be widened.

According to a first variant of the first embodiment, said blade(s) are laid out perpendicular to a substrate, said substrate being intended to be laid out in a plane perpendicular to the plane of incidence of the incident radiation.

For example, the substrate is itself formed from a polar crystal and said blade or blades are formed by etching in the substrate. The detection cell then comprises a first connection terminal in contact with the substrate and, for each blade, a second connection terminal in contact with the edge of the blade opposite the substrate, the group of second connection terminals being electrically connected in the case of a plurality of blades.

According to another example, the detection cell comprises, for each crystal blade, a first connection terminal in contact with a first edge of the blade adjacent to the substrate and a second connection terminal in contact with a second edge of the blade adjacent to the substrate and opposite the first edge, the group of first connection terminals on the one hand and the second connection terminals on the other hand being connected in the case of a plurality of blades.

According to a second variant of the first embodiment, said blade or blades are laid out in a plane and form a membrane suspended over a substrate, the plane of the membrane being intended to be laid out in a plane perpendicular to the plane of incidence of the incident radiation.

For example, the cell comprises, for each blade, a first connection terminal in electrical contact with a first edge of the blade arranged on the substrate and a second connection terminal in electrical contact with a second edge of the blade arranged on the substrate and opposite the first edge, the group of first connection terminals on the one hand and the second connection terminals on the other hand being connected in the case of a plurality of blades.

According to a second embodiment of a detection cell according to the invention, the polar crystal forms at least one thin layer surrounded by at least one first and one second barrier layers of a semi-conductor dielectric material with a high energy gap to form with the polar crystal layer at least one quantum well.

For example the coupling means comprise a group of optical nano-antennas and a mirror so as to form an optical resonance cavity in which said quantum wells are located.

Advantageously, the coupling means in addition comprise a spacer to adapt the width of said optical resonance cavity.

The cell according to the second embodiment can comprise at least one first and one second connection terminals in electrical contact with two opposite edges of the thin layer of polar crystal.

According to a second aspect, the invention relates to a terahertz detector comprising one or a plurality of detection cells according to the first aspect and an electrical reading circuit suitable for measuring the impedance variation of the crystal between said connection terminals of each of the detection cells.

According to a third aspect, the invention relates to a method for detecting an incident radiation of terahertz frequency included in the Reststrahlen band of a semi-conductor polar crystal comprising the steps of:

resonant coupling of the incident terahertz frequency radiation and of an interface phonon polariton at an interface of the polar crystal and a dielectric material.

measurement of the impedance variation of the crystal between two opposite ends of said interface, resulting from the absorption by the free carriers of the crystal of the interface phonon polaritons thus excited.

BRIEF DESCRIPTION OF THE FIGURES

Other features and advantages of the invention will appear on reading the following description, illustrated by the figures in which:

FIG. 6 schematically shows a variant of a detection cell according to the first embodiment of the invention.

FIGS. 7A and 7B shows two examples of implementation of a detection cell of the type shown in FIG. 6.

DETAILED DESCRIPTION

Figure 1:
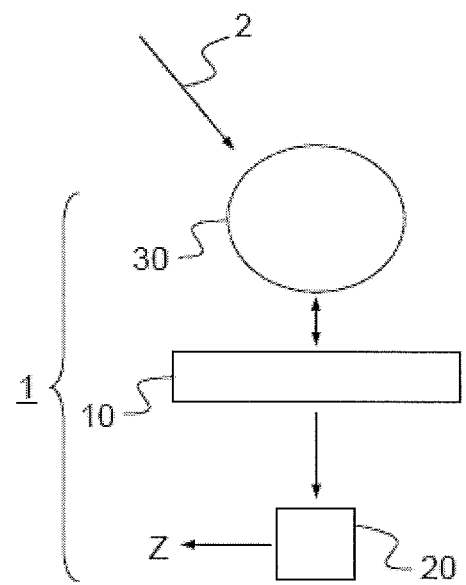
FIG. 1 is a diagram schematically illustrating an implementation of the invention.

FIG. 1 is a diagram that schematically shows a terahertz detector according to the invention in an example of implementation. In this example, a terahertz detector 1 according to the invention is illuminated by incident terahertz radiation 2. The detector 1 generally comprises a detection cell with an active material 10 comprising a semi-conductor polar crystal and coupling means 30, as well as an electrical reading circuit 20 suitable for measuring an impedance (Z) and comparable to the reading circuits used in bolometers. For example, a current source can be placed in series with the detection cell and the variation of potential at the terminals of the cell can be measured.

The polar crystal 10 comprises an interface with a dielectric medium (not shown in FIG. 1), for example a vacuum, air, or a material behaving as a dielectric around the predetermined frequency of the incident terahertz radiation 2.

Generally, a crystal, the atoms of the elementary lattice of which possess different electronegativities, is called a polar crystal. In polar crystals, the movement of the atoms with respect to each other influences the polarizability and therefore the dielectric function. The polar crystals exhibit a resonance in their dielectric function related to optical phonons in a frequency band called the Reststrahlen band. In this Reststrahlen band, the real part of the dielectric function is negative. The material then behaves optically as a metal (the reflectivity thereof strongly increases) and it can support surface phonon polaritons, a combination between an optical phonon and an electromagnetic wave, said surface phonon polaritons propagating at the interface between the polar crystal and the dielectric medium. The resonance of the dielectric function is very well modelled by a Lorentz model, and the dielectric function can be written, according to Born et al. (M. Born and K. Huang "Dynamical theory of crystal lattices", Oxford University Press, New York, 1954, (pages 12 and 23)):

$$\varepsilon(\omega) = \varepsilon_\infty \left(1 + \frac{\omega_L^2 - \omega_T^2}{\omega_T^2 - \omega^2 - i\Gamma\omega}\right) \quad (1)$$

Where $\omega_L$ and $\omega_T$ are the frequencies of the longitudinal and transverse optical phonons respectively and $\Gamma$ is a damping term.

Figure 2A:
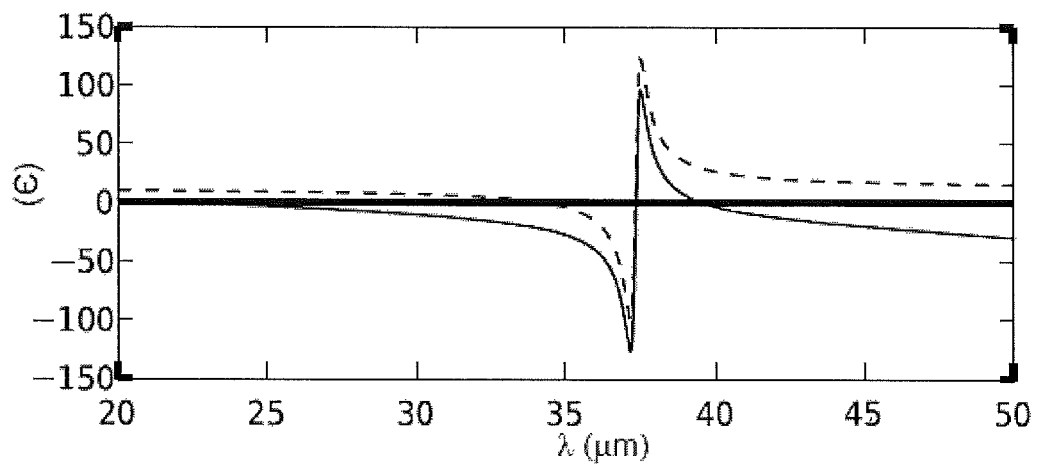
FIGS. 2A and 2B are curves respectively showing the evolution of the real part and the imaginary part of the dielectric function as a function of wavelength for two levels of doping in GaAs.
Figure 2B:
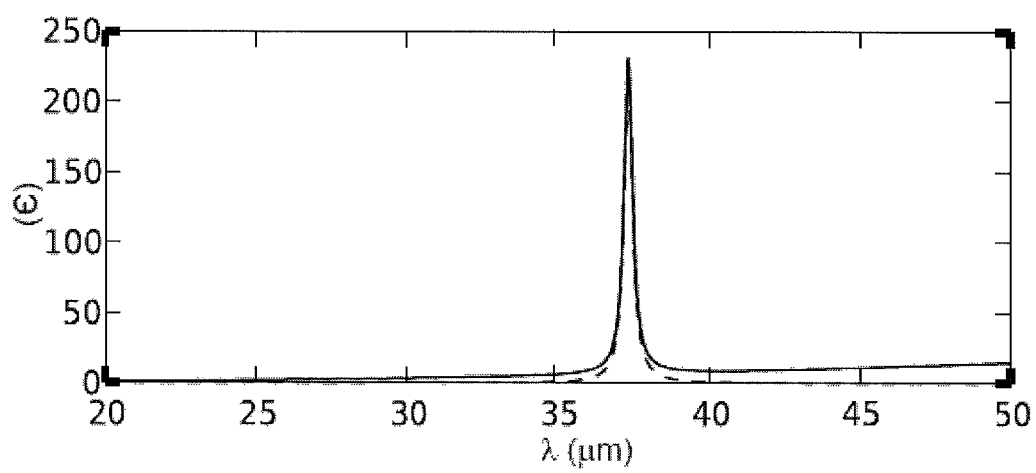

FIGS. 2A and 2B show the real part and the imaginary part of the dielectric function respectively as a function of wavelength for gallium arsenide (GaAs), typical of polar crystals, respectively for pure GaAs (dotted curve) and for GaAs doped with a carrier density of $1.5 \times 10^{18}$ cm$^{-3}$ (solid curve). The conditions for the existence of surface phonon polaritons for GaAs are fulfilled in a restricted wavelength range. For a GaAs/air interface, for example, the wavelength range where the surface wave can exist is given by the relation Re(∈)<−1, where ∈ is the dielectric function of GaAs. This corresponds to the following wavelength range: 35.57 µm<λ<37.30 µm. For doped GaAs, the range of wavelengths corresponding to the conditions for the existence of surface phonon polaritons is widened.

While most published studies have sought to avoid the frequency ranges corresponding to the Reststrahlen zone in which the resonance brings about extremely rapid variations in the dielectric function, the applicant has shown that the existence of these interface phonon polaritons can be put to good use for designing detectors that are extremely effective in the terahertz domain, as will be demonstrated in the following description with examples of particular implementations.

More precisely, the present invention makes it possible to detect (convert into an electrical signal) an optical signal in the Reststrahlen band (border infrared −Thz) of the active material, by resonant absorption of interface phonon polaritons (IPhPs). The latter, carried by the interface(s) of a polar crystal blade (active zone of the device) with the adjacent dielectric medium, excite by absorption the free carriers present in the blade. This increase in kinetic energy leads to a modification of the mobility of the carriers that is measured in the external circuit as a modification of the impedance of the device. Advantageously, the measurement is made at very low current (typically a nanoampere) to maintain the population of free carriers in the regime of mobility; the heating effects and the electrical consumption of the photodetector are therefore negligible. The increase in the kinetic energy from thermodynamic equilibrium of the free carriers can strongly modify the transport conditions of said free carriers. Advantageously, the case of a population forming a two-dimensional gas will be considered. Indeed, the transition of a carrier from a sub-band of energy to a higher sub-band presents a threshold for the energy of the carrier, due to the conservation of energy. The applicant has shown that by judiciously placing a high proportion of the population below this threshold, the latter has an elevated mobility that will be the reference non-illuminated situation. Illumination by terahertz radiation increases the probability of absorption by a free carrier of the IPhPs due to the resonant excitation of the latter. This results in an increase in the number of inter-sub-band transitions. On the other hand the carriers in the upper sub-band relax very quickly ($\tau$<1 ps) to the ground sub-band by emission of an IPhP or of a longitudinal optical phonon. These back and forth transitions between the two sub-bands lead to a significant reduction of the mobility, including at ambient temperature, allowing terahertz photodetectors to operate at 300K. In addition, the very low relaxation time for the carriers down to the ground sub-band leads to a very high intrinsic response speed for said photodetectors.

Potentially beneficial polar crystals for the generation of surface phonon polaritons in the terahertz frequency domain are the III-V semi-conductors, for example gallium arsenide (GaAs), aluminum arsenide (AlAs), indium phosphide (InP), indium arsenide (InAs) and gallium phosphide (GaP). The II-VI semi-conductors are also polar crystals exhibiting Reststrahlen bands in the spectral band of interest, for example ZnSe, HgTe, CdTe, as well as the IV-IV elements such as SiC, the I-VII elements or alloys composed of 3 (ternary), 4 (quaternary) or more elements. Generally, the Reststrahlen band of these materials is situated in the far infra-red, between 10 and 50 microns, i.e. between 6 and 30 terahertz.

According to a variant, a doped polar crystal can be used to increase the number of carriers. The level of doping is determined so as to achieve maximum sensitivity and to reduce the noise of the unit formed by the detector and its reading circuit (20). A typical concentration of carriers will be from $5 \times 10^{17}$ to $10^{18}$ cm$^{-3}$ for a (3D) volume transport and from $5e^{11}$ to $2e^{12}$ cm$^{-2}$ for a two-dimensional gas.

Since interface phonon polaritons are evanescent modes, it is not possible, however, to couple them with an incident propagating field by simply illuminating a flat surface. The coupling means 30 allow the coupling of the incident terahertz radiation 2 and the evanescent field of the interface phonon polariton carried by the interface between the polar crystal and the dielectric medium to be made.

For example, in an embodiment where the incident terahertz radiation 2 is a plane wave in free space, the coupling means can comprise a prism in an Otto configuration, a prism in a Kretschman configuration, a coupling grating, a single optical antenna or a series of such antennas. The coupling means can be obtained for example by a structure of the polar crystal itself (optical antenna, grating) or by a structure in the form of thin layers to generate a resonant cavity, as will be described later. The coupling then leads to a resonant absorption and can be seen by an impedance variation at the terminals of the polar crystal supporting the IPhPs. A spectral detection band of the detection cell can thus be defined, corresponding to the frequency coupling band defined as the frequency band included in the Reststrahlen band of the crystal for which the coupling means 30 allow resonant coupling of the terahertz radiation and an interface phonon polariton.

In an alternative embodiment, the incident terahertz radiation 2 can be a guided wave or a surface wave. The means for coupling the detection cell to the guide will be an impedance adapter ("taper") allowing optimal transmission of the guide to the modulator to be achieved.

In the continuation of the description, two principal embodiments are described for implementing a Thz detection cell according to the invention. The first embodiment, described by means of FIGS. 3 to 7, implements a polar crystal structure in the form of a crystal blade forming a coupling antenna for the incident radiation, while the second embodiment, described by means of FIGS. 8 to 9, implements a polar crystal structure in the form of a thin layer situated between two layers of semi-conductor dielectric material with a high energy gap with respect to the polar crystal to form a quantum well, this group of layers being placed within an optical cavity.

Examples of implementation of a terahertz detection cell according to the first embodiment are described first.

FIGS. 3A to 3D show two examples of a THz detection cell according to the first embodiment.

In these examples, the polar crystal is structured to form one or a plurality of crystal blades 330. The active part of the detection cell is thus formed from polar semi-conductor blades (for example GaAs) which are preferably very thin (thickness less than 100 nm), the large sides of which are in contact with a dielectric medium. These interfaces support interface phonon polaritons (IPhPs) in the Reststrahlen domain of the semi-conductor used. The limiting conditions imposed at the ends of these sides and the coupling between the interface phonon polaritons supported by each side allow a resonator to be formed for a given choice of the dimensions of the blade, essentially the width and height thereof. Almost total absorption of the THz wave at resonance can thus be obtained. Each blade thus forms an optical antenna for coupling with the incident radiation. An optical antenna is generally understood to be an element capable of transferring the energy of the incident radiation into a more confined volume. Optical nano-antennas have been widely studied and the article by L. Novotny et al. ("Antennas for light", Nature Photonics, Vol 5, February 2011) provides a very good description thereof. Here, the blade of polar crystal is sized, so as to form a resonator the dimensions of which are adjusted as a function of the desired frequency properties of the coupling. The resonator creates an evanescent field which will allow coupling with the incident radiation to be achieved, allowing the energy of the incident wave to be confined. The frequency properties of the coupling can thus be adjusted by the choice of dimensions of the blades. The choice of a group of blades can, for example, allow a greater detection area to be covered. Blades of identical shape and size can then be chosen to optimize the coupling in a narrow spectral detection band or, on the other hand, by varying the shape and/or the size of the blades, the spectral detection band can be widened. For example, in the case of crystal blades, blades could be chosen the large faces of which are square or rectangular and with different sizes. In addition, it is possible to provide a periodic layout of these antennas, for example to facilitate the fabrication of the component; however, the periodicity and the density of the distribution of the antennas has little effect on the coupling, the coupling being obtained by the single effect of the radiation of the evanescent field by the antenna. However, the antennas should not be spaced too far from each other so as not to excite diffracted orders. Typically, the antennas will be separated by a distance less than the wavelength. Finally, the antennas can be chosen to be arranged along a principal direction. Alternatively, they can be chosen to be arranged along two substantially perpendicular directions, so as to remove the sensitivity of the component to the polarization of the incident terahertz radiation.

Figure 3A:
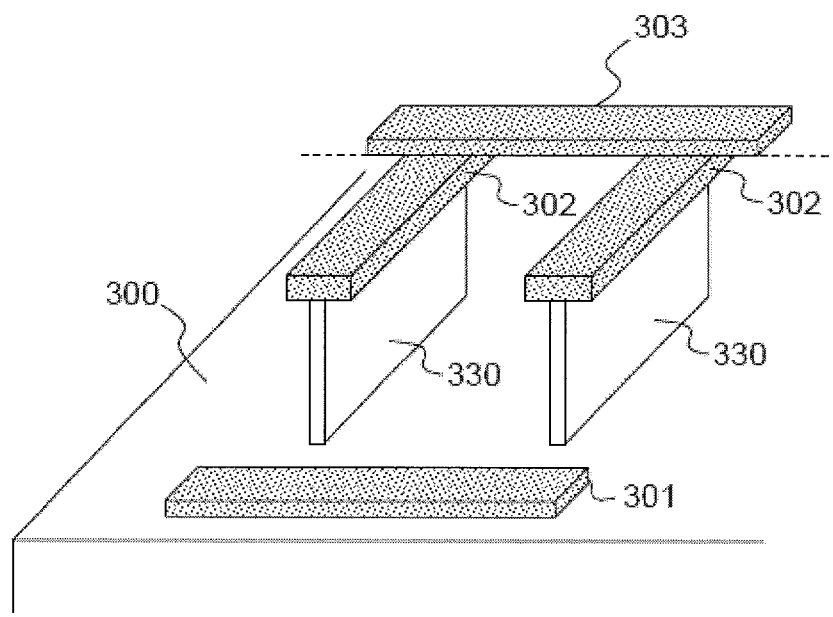
FIGS. 3A to 3D show a terahertz detection cell according to a first embodiment of the invention, according to two variants.

In the example in FIG. 3A, the blades 330 are fabricated, for example, by anisotropic etching of a bulk polar crystal (for example on a substrate 300 of GaAs). Two types of ohmic contacts forming the connection terminals of the cell are fabricated for the measurement of the impedance. A first (301) is arranged directly on the doped substrate, the other (302) is arranged on the top of each blade. A collecting terminal strip 303 is fabricated to collect the currents from the group of contacts 302. The impedance of the device is then measured between the contact 301 and the collecting terminal strip 303.

Figure 3B:
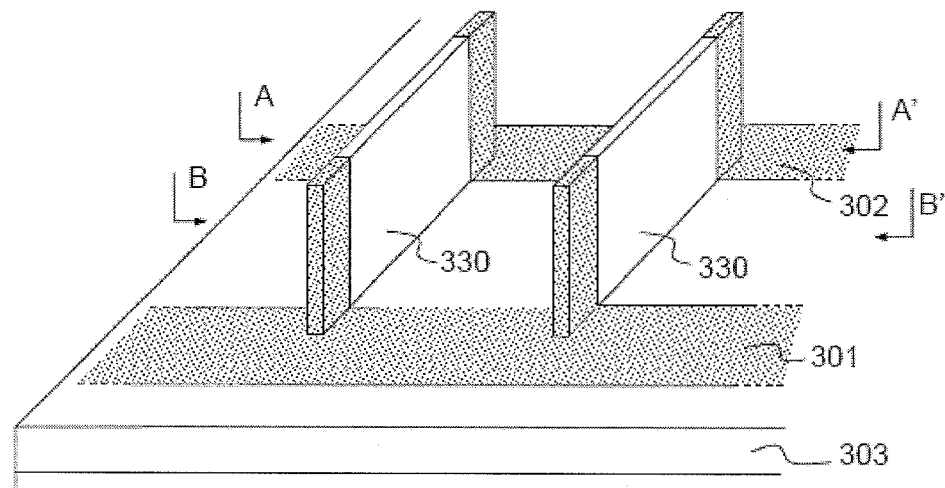
Figure 3C:
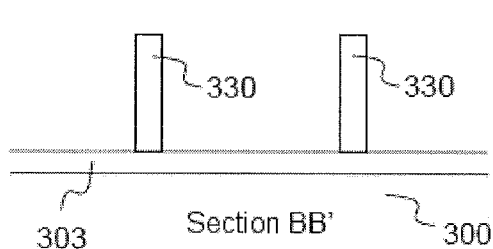
Figure 3D:
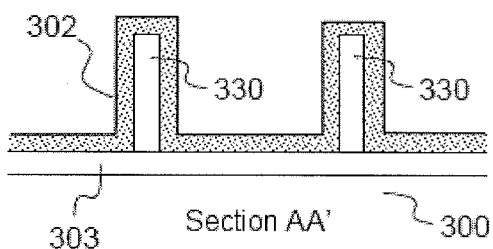

In the example shown by means of FIGS. 3B to 3D, the blades 330 are fabricated, for example, by anisotropic etching of a polar crystal formed by epitaxy (GaAs in the example) on a stop layer 303, formed, for example, from AlGaAs, allowing the etching to be stopped on this layer. The impedance of the device is measured between the electrical contacts 301 and 302 forming the connection terminals of the detection cell and formed at each end of the blades. Advantageously, the contacts are formed by a metallic deposit forming two continuous bands connecting the ends of the blades and positioned on the stop layer 303. The structure shown by means of FIGS. 3B to 3D is thus fabricated on a stack of epitaxially formed layers associating various materials and various levels of doping to allow the etching of the blades 330 to be stopped on the stop layer 303 and the blades 330 constituting the active zone to be electrically insulated with respect to the substrate 300 and metallic bands constituting the contact connectors (301 and 302). An example of a stack of epitaxially formed layers is given in table 1 below:

TABLE 1

| Layer | Material | Level of doping | Thickness |
| --- | --- | --- | --- |
| Active | GaAs | $N_D = 1e18\ cm^{-3}$ | 2 μm |
| Stop | AlGaAs | n/a | 0.1 μm |
| Substrate | GaAs | n/a | 350 μm |

Figure 4A:
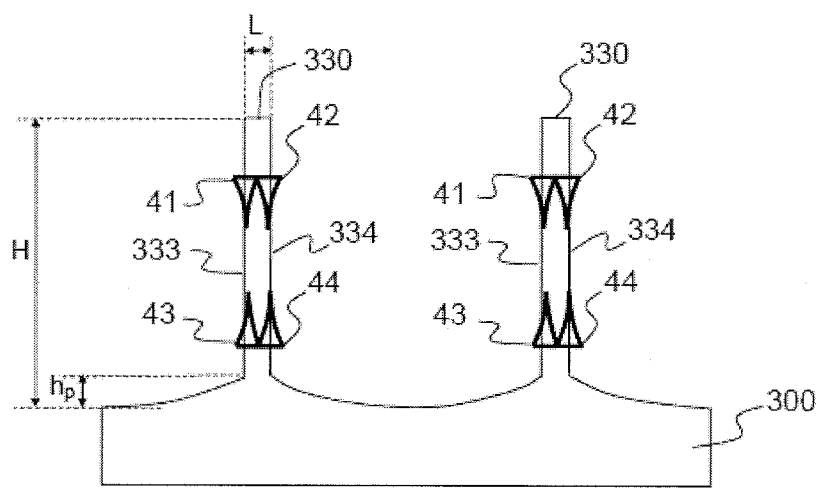
FIG. 4A schematically represents the coupling of the interface phonon polaritons in a terahertz detection cell according to the first embodiment of the invention and FIG. 4B shows the curve of reflectivity as a function of wavelength calculated in a device of the type shown in FIG. 4A.
Figure 4B:
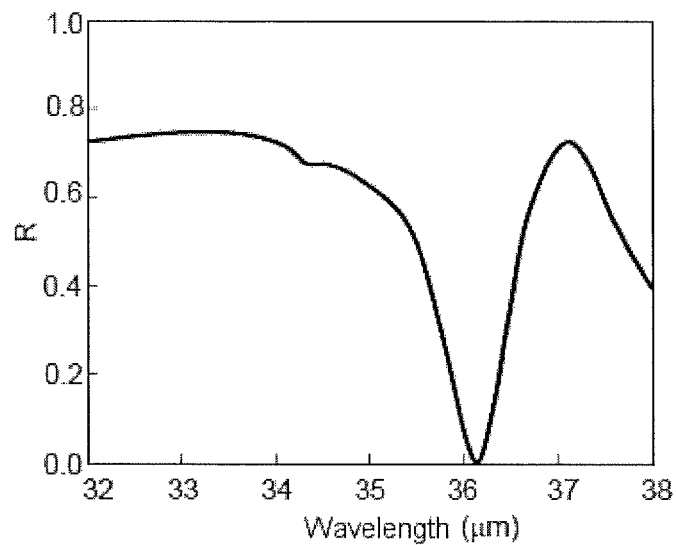
Figure 5:
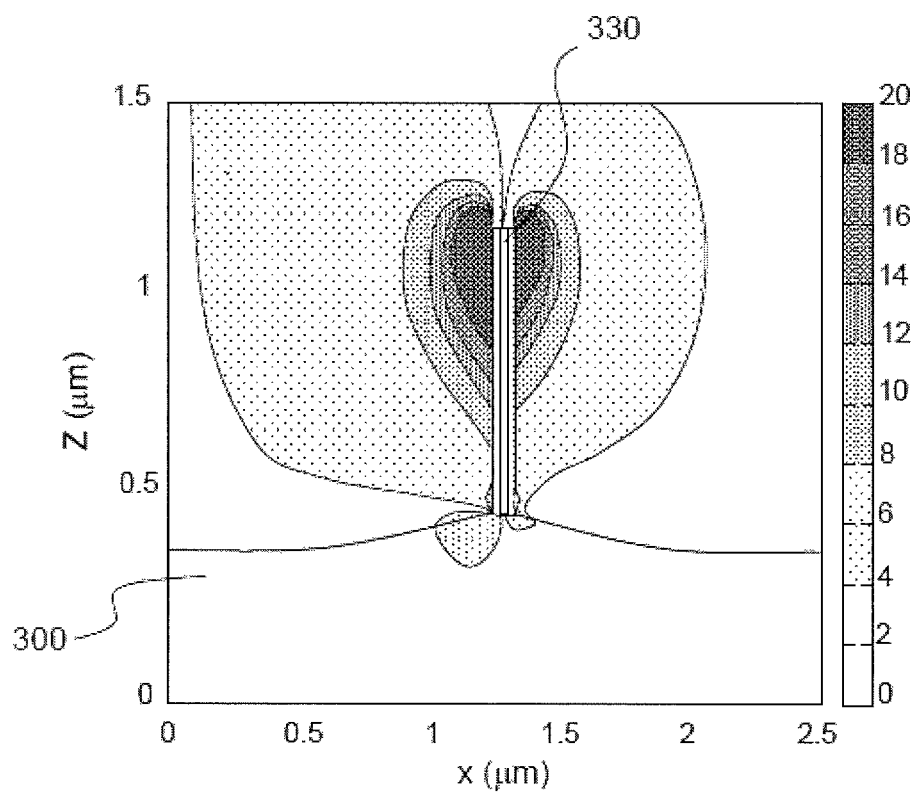
FIG. 5 shows the intensity of the electrical field calculated in the vicinity of an interface between the polar crystal and a dielectric in the terahertz detection cell according to the first embodiment of the invention.

FIGS. 4A, 4B and 5 show in more detail the mechanism of absorption of the incident radiation in the example shown in FIG. 3A. Each crystal blade 330 has a rectangular cross section which rises perpendicularly at the surface of a substrate 300. The blade 330 comprises parallel sides 333, 334 each forming an interface between the polar crystal and the neighboring dielectric medium, in this example a vacuum or air. Alternatively, the blade of polar crystal can be surrounded by a dielectric material, for example an organic dielectric material of resin type. The interfaces 333, 334 support the interface phonon polaritons 41-44. Each crystal blade 330 has dimensions (height H and width L) very much shorter than the wavelength of the incident terahertz radiation 2.

Advantageously, the width L is sufficiently low to allow coupling between the interface phonon polaritons 41-43 propagating at the interface 333 and the phonon polaritons 42-44 propagating at the interface 334 of the two sides of the blades 330. This allows the confinement of the electromagnetic field to be increased by increasing the effective index of the mode. The applicant has shown that a width of the blades typically less than a hundred or so nanometers allows such a coupling to be achieved.

When the blade is of a substantially rectangular shape, only the vertical modes will exist and the height H of the blade will be sought to be optimized as a function of the wavelength of the desired coupling. Generally, the height H of the optical antennas will be chosen to be of the order of $\lambda_r/4n_{eff}$ where $\lambda_r$ is the resonant frequency and $n_{eff}$ the effective index of the mode. The effective index strongly depends on the nature of the polar crystal and the level of doping thereof. For example, for a polar crystal of GaAs, the resonance wavelength is close to 35.5 microns. The thickness of the optical blade can be chosen to be between 60 and 80 nm, the height of the antennas of the order of 800 nm, the effective index being between 7.5 and 10 for a doping of $1.5 \times 10^{18}$ cm$^{-3}$. In the case of a square shaped blade, the resonator can present both horizontal and vertical modes and the optimization parameters of the resonator will be modified. A fine optimization of the resonator can be done numerically using codes of the type "Rigorous Coupled Wave Analysis" (RCWA), described notably in L. Li, Journal of Optical Society of America A, 14(10), 2758 (1997), or "Rigourous Maxwell with Constitutive B-spline approximation" (RMCB) described in P. Bouchon, Journal of Optical Society of America A, 27(4), 696 (2010). Commercial codes (Reticolo) can also be used. The frequency and intensity of the coupling can thus be adjusted by modifying the width L and the height H of the blades 330 around the nominal values thereof, thus allowing the coupling frequency band and therefore the spectral detection band of the terahertz detector to be adjusted.

As an example, FIG. 4B shows the reflectivity R of a grating according to the embodiment shown in FIG. 4A, with a polar crystal of GaAs. For the calculation of the reflectivity, the following parameters have been considered: the period of the walls 330 equal to 2.5 µm, the height of the walls equal to 2.8 µm, height $h_p$ equal to 600 nm, width of the walls equal to 65 nm. It is seen in this figure that the reflectivity falls to zero at a wavelength close to 36 µm (corresponding to a frequency of 8.3 terahertz included in the Reststrahlen band of GaAs), due to the resonant coupling between the incident terahertz wave and the interface phonon polaritons.

FIG. 5 shows the confinement of the electric field in a structure such as that of FIGS. 3A and 4. The intensity of the electric field along a direction perpendicular to the interfaces 333 and 334, and normalized by the intensity of the incident electric field, is calculated (RCWA, RMCB or Reticolo) for a periodic layout of resonant antennas. FIG. 5 shows only one period (2.5 microns) of the periodic structure. The antenna shown is of GaAs doped at $1.5 \times 10^{18}$ cm$^{-3}$, and is 800 nm high, 80 nm wide. The high effective index of the coupled mode between the two interfaces 333, 334 allows the electromagnetic field to be confined in a very small volume. The confinement of the field allows greater excitation of the interface modes to be achieved and therefore the absorption of the IPhPs by the free carriers present in the blades, to be enhanced. The applicant has thus demonstrated that at resonance, for a polar crystal of doped GaAs, the volume of the coupled mode is of the order of $\lambda^3/10^6$ where $\lambda$ is the wavelength of the incident terahertz radiation.

FIG. 6 shows a variant of the detector according to the first embodiment. According to this variant, the polar crystal is structured to form a group of polar crystal blades 630 separated by slits and forming a structured membrane, suspended above a substrate 600. The geometry of the polar crystal blades 630 situated between two slits corresponds to the geometry of the blades 330 of the embodiment previously described. As in the examples of FIGS. 3A and 3B, the crystal blades 630 form coupling antennas for coupling the incident radiation with the interface phonon polaritons supported at the interfaces of the crystal blades with the surrounding dielectric medium. The thickness of the membrane e corresponds to the width L of the walls 330 and the width E of the blades 630 corresponds to the height H of the blades 330. As for the previous embodiment, the periodicity is of little importance. The impedance of the device is measured between the electrical contacts 601, 602 created at each end of the blades.

The structure shown in FIG. 6 is fabricated, for example, on a stack of epitaxially formed layers associating various materials and various levels of doping to allow the etching into the active part, on the one hand, and into the substrate, on the other hand, to stop during the fabrication of the membrane, as well as the electrical insulation of the blades constituting the area that is active with respect to the substrate 600. An example of a stack of epitaxially formed layers is given in table 2 below:

TABLE 2

| Layer | Material | Level of doping | Thickness |
| --- | --- | --- | --- |
| Active | GaAs | $N_D$ = 1e18 cm$^{-3}$ | 50 nm |
| Stop | AlGaAs | N/A | 0.1 µm |
| Substrate | GaAs | N/A | 350 µm |

The blades are fabricated, for example, in four steps: (1) structuring of the active layer 630 (GaAs in the example) followed or preceded by (2) the fabrication of a membrane by the opening up of a window in the substrate 600 then (3) removal of the stop layer 603 in the window (rear side) and lastly (4) removal of the active layer on the front side apart from the window. The impedance of the device is measured between the electrical contacts 601, 602 formed at each end of the blades.

FIGS. 7A and 7B show two examples of layouts of crystal blades in different variants illustrated in FIGS. 3B and 6 (electrical contacts 701, 702 formed at the ends of the blades). The structure shown in FIG. 7A comprises blades 730 laid out principally along one direction. This structure is therefore sensitive to the polarization of the incident light. Structuring along two directions is possible (FIG. 7B) to obtain a device that is insensitive to the polarization. In this case the blades are laid out along two substantially perpendicular directions.

In addition, it is possible to modify the wavelength of the resonance by modifying the height and/or the thickness of the blades. Thus, by fabricating a device the blades of which do not all have the same geometry, it is possible to widen the spectral detection response of the device. On the other hand, by coupling together the electrical connections of the blades with the same shape, it is possible to create a polychromatic THz detector, i.e. supplying an electrical signal specific to each resonant wavelength.

Figure 8:
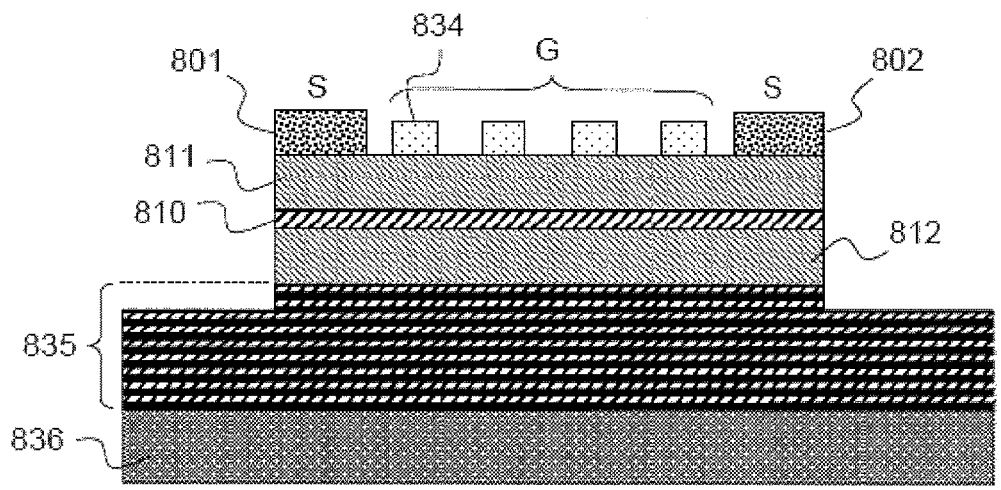
FIG. 8 shows a terahertz detection cell according to a second embodiment of the invention.
Figures 9A, 9B:
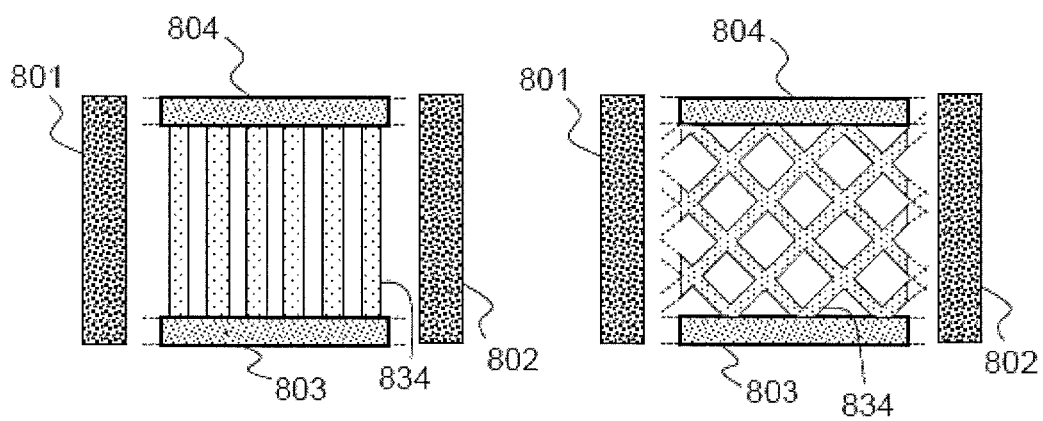
FIGS. 9A and 9B shows two examples of implementation of a detection cell of the type shown in FIG. 8.

An example of implementation of a THz detector according to the second embodiment is then described by means of FIGS. 8, 9A and 9B (top views of FIG. 8 according to two variants).

In this embodiment, the polar crystal forms a thin layer 810 in a stack of successive thin layers of semi-conductor material, and the coupling means are formed by a group of optical antennas 834 associated with a mirror 836 so as to form an optical cavity inside of which the stack of thin layers of semi-conductor material is laid out. Advantageously, a spacer 835 makes it possible to adjust the width of the cavity.

More precisely, the stack of thin layers successively comprises a first barrier layer 811, the thin layer of polar crystal 810 and a second barrier layer 812. The barrier layers 811 and 812 each have an interface 815, 816 with the polar crystal 810 and are formed of dielectric semi-conductor materials having a high energy gap with respect to the polar crystal 810 so that the stack of the first barrier layer 811, the thin layer of polar crystal 810 and the second barrier layer 812 form a quantum well the transport properties of the free carriers of which are used to measure the absorption of the incident THz radiation, as will be described below. The wide gap materials of the layers 811 and 812 are chosen depending upon the polar crystal 810 used. For example, the polar crystal 810 can be formed from GaAs and the barrier layers 811 and 812 can be formed from an AlGaAs alloy with 33% aluminum, for example $Al_{33}Ga_{67}As$. Advantageously, all of these layers will be deposited by epitaxy.

The thicknesses of the layers 810, 811 and 812 are dictated by the electronic design of the structure. In particular, the thickness of the layer 810 is chosen so that the transition energy between the energy levels of the quantum well formed by the layers 811-810-812 is close to the energy of the interface mode supported by the polar crystal 810. For example, for a quantum well of GaAs and barrier layers of $Al_{33}Ga_{67}As$, the desired energy is 36 meV, which gives a thickness of GaAs of 21 to 22 nm.

The coupling means are formed, in this example, by a group of optical antennas 834, advantageously metallic, associated with a mirror 836 so as to form an optical cavity. The thickness of the cavity, which can be adjusted by a spacer 835, and the parameters of the optical antennas 834 are determined to excite an interface phonon polariton mode at the interfaces 815 and 816 between the polar crystal 810 and the barrier layers 811 and 812. The optical cavity allows the electromagnetic field to be concentrated in the quantum well by adjusting the size of the spacer 835. The mirror 836 is, for example, a substrate of doped GaAs, the doping allowing the GaAs to be rendered reflective at the wavelengths considered, or of metal, for example of gold. The formation of this cavity can allow the intensity of the field in the cavity to be enhanced by a factor of 5. Thus, the applicant has shown that good use can be made of the fact that the dielectric function of the polar crystal 810 is close to zero at the wavelength of the interface mode related to the quantum well. This allows the field to be very confined in the polar crystal. For example, in the case of a quantum well of GaAs and barriers of $Al_{33}Ga_{67}As$, the enhancement factor for the field intensity is 140.

The structure therefore benefits from two effects (cavity and dielectric function close to 0) to finally give an enhancement factor for the field intensity of about 700 while confining the electromagnetic field in the quantum well.

Advantageously, a protection layer (not shown), for example of GaAs, is deposited on the barrier layer 811 to prevent oxidation of this layer.

The population of the quantum well is assured by an addition of carriers. This addition can be performed in various ways, known from the physics of field effect transistors (HEMT—High Electron Mobility Transistors). For example, in the structure of FIG. 8, a doping plane (density $8 \times 10^{12}$ cm$^{-2}$) is added to the barrier 811. Alternatively, the well can be directly doped or a volume doping of the barrier layer can be performed.

Other variants of the geometry of the wells can also be envisaged. For example, according to one variant, a system formed from a plurality of quantum wells could be used.

The optical antennas can be arranged parallel to each other to form a metallic one-dimensional grating (see FIG. 9A). Alternatively, a grating having a pattern in two dimensions with two perpendicular series of parallel antennas (see FIG. 9B) can be laid out to allow the structure to be insensitive to the polarization of the incident THz radiation. For example, the coupling grating 834 can be formed from gold (Au). Advantageously, an attaching layer (not shown) is interposed between the upper layer of the stack and the coupling grating 834 to favor the adherence of the antennas to the detector. For example, the attaching layer can be formed from titanium (Ti). The spacer can be fabricated by epitaxy onto the doped GaAs substrate. The spacer 835 can be formed, for example, from an AlGaAs alloy with 50% aluminum. Advantageously, the spacer 835 can be formed from alternating thin layers (a super-grating) of GaAs and AlAs. In the case of a reported technology, this layer can also be formed by another material ($Si_3N_4$, $SiO_2$ for example).

Two contacts S (801) and D (802) are formed on each side of the detector to measure the impedance variations of the quantum well. They make an ohmic contact (linear current-voltage characteristics) with the free carriers of the two-dimensional gas of the quantum well. They are fabricated according to the known technology for source and drain contacts of HEMT transistors (see, for example, V. L. Rideout, Solid-State Electronics, Volume 18, Issue 6, 1975, Pages 541-550).

On the other hand, the metallic optical antennas can be connected to a contact G (803, 804 in FIGS. 9A, 9B) that, by application of a voltage, allows the carrier density in the two-dimensional gas and the difference in energy between the sub-bands of the quantum well to be modified. This latter control allows the resonant absorption wavelength of the detector to be shifted in the Reststrahlen domain.

A detection cell according to the second embodiment such as described in FIG. 8 is fabricated, for example, according to the following fabrication steps. The layers 835, 812, 810, and 811 are deposited by epitaxy on a doped GaAs substrate 836. UV lithography is then performed on a photosensitive resin to define the geometry of the grating. The protection layer is chemically etched and the layers comprising the optical antennas (attaching and metallic layers 834) are deposited by evaporation.

With respect to the first embodiment of the invention, the detector according to the second embodiment allows greater confinement of the electromagnetic field to be obtained leading to more effective absorption and the electrical control allows the resonant absorption wavelength to be shifted in the Reststrahlen band.

Although described through a certain number of detailed examples of implementation, the detection cell for terahertz radiation according to the invention comprises different variants, modifications and improvements that will appear obvious to a person skilled in the art, it being understood that these different variants, modifications and improvements fall within the scope of the invention, such as defined in the following claims.

The invention claimed is:

1. A terahertz detection cell for the detection of radiations of frequencies included in a given spectral detection band, comprising:
   a semi-conductor polar crystal having a Reststrahlen band covering said spectral detection band and having at least one interface with a dielectric medium;
   coupling means allowing the resonant coupling of an interface phonon polariton (IPhP) supported by said interface and of an incident radiation of frequency included in said spectral detection band; and
   at least one first and one second connection terminals in electrical contact respectively with a first and a second opposite ends of said interface and intended to be connected to an electrical reading circuit for the measurement of the impedance variation of the crystal between said opposite ends of the interface.

2. The detection cell as claimed in claim 1, in which said polar crystal has at least two interfaces with a dielectric medium, said interfaces being sufficiently close to allow the coupling of interface phonon polaritons propagating along each of the interfaces.

3. The detection cell as claimed in claim 2, in which the distance between the two interfaces is less than a hundred nanometers.

4. The detection cell as claimed in claim 1, in which the polar crystal is doped.

5. The detection cell as claimed in claim 1, in which the polar crystal is structured to form one or a plurality of crystal blades each forming an optical antenna intended for coupling with the incident radiation, the large faces of each of said blades forming two interfaces with a dielectric medium, connection terminals being in contact with two opposite ends of said blades.

6. The detection cell as claimed in claim 5, in which the polar crystal is structured to form a group of a plurality of blades laid out along a principal direction.

7. The detection cell as claimed in claim 5, in which the polar crystal is structured to form a group of a plurality of blades laid out along two substantially perpendicular directions.

8. The detection cell as claimed in claim 5, in which the polar crystal is structured to form a group of a plurality of identical blades.

9. The detection cell as claimed in claim 5, in which the polar crystal is structured to form a group of a plurality of identical blades and at least a part of the blades have a different shape from that of the others, allowing the detection frequency band to be widened.

10. The detection cell as claimed in claim 5, further comprising a substrate, and in which said blade or blades are laid out perpendicular to said substrate.

11. The detection cell as claimed in claim 10, in which the substrate is of a polar crystal and said blade(s) are formed by etching in the substrate, the detection cell comprising a first connection terminal in contact with the substrate, and, for each blade, a second connection terminal in contact with the edge of the blade opposite the substrate, the group of second connection terminals being electrically connected in the case of a plurality of blades.

12. The detection cell as claimed in claim 10, comprising, for each blade, a first connection terminal in contact with a first edge of the blade adjacent to the substrate and a second connection terminal in contact with a second edge of the blade adjacent to the substrate and opposite the first edge, the group of first connection terminals on the one hand and second connection terminals on the other hand being connected in the case of a plurality of blades.

13. The detection cell as claimed in claim 5, further comprising a substrate, and in which the said blade(s) are laid out in a plane and form a membrane suspended over said substrate the plane of said membrane being substantially parallel to that of said substrate.

14. The detection cell as claimed in claim 13, comprising, for each blade, a first connection terminal in electrical contact with a first edge of the blade arranged on the substrate and a second connection terminal in electrical contact with a second edge of the blade arranged on the substrate and opposite the first edge, the group of first connection terminals on the one hand and second connection terminals on the other hand being connected in the case of a plurality of blades.

15. The detection cell as claimed in claim 1, in which the polar crystal forms at least one thin layer surrounded by at least one first and one second barrier layers of semi-conductor dielectric material with a high energy gap so as to form with the polar crystal layer at least one quantum well.

16. The detection cell as claimed in claim 15, in which the coupling means comprise a group of optical nano-antennas and a mirror so as to form an optical resonance cavity inside of which said quantum well(s) are located.

17. The detection cell as claimed in claim 15, in which the means of coupling further comprise a spacer to adapt the width of said optical resonance cavity.

18. The detection cell as claimed in claim 15, further comprising at least one first and one second connection terminals in electrical contact with two opposite edges of the thin layer of polar crystal.

19. A terahertz detector comprising one or a plurality of detection cells as claimed in claim 1 and an electrical reading circuit suitable for measuring the impedance variation of the crystal between said connection terminals of each of the detection cells.

20. A method for detecting an incident radiation of terahertz frequency included in the Reststrahlen band of a semi-conductor polar crystal comprising the steps of:
resonant coupling of the incident terahertz frequency radiation and of an interface phonon polariton at an interface of the polar crystal and a dielectric material; and
measurement of the impedance variation of the crystal between two opposite ends of said interface, resulting from the absorption by the free carriers of the crystal of the interface phonon polaritons thus excited.

* * * * *